(12) United States Patent
Otsuki et al.

(10) Patent No.: US 8,969,862 B2
(45) Date of Patent: Mar. 3, 2015

(54) ORGANIC ELECTROLUMINESCENT ELEMENT, METHOD FOR MANUFACTURING ORGANIC ELECTROLUMINESCENT ELEMENT, AND COATING LIQUID FOR ELECTRON INJECTION AND TRANSPORT LAYER

(75) Inventors: Eiji Otsuki, Tokyo-to (JP); Shigehiro Ueno, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 14/008,243

(22) PCT Filed: Dec. 13, 2011

(86) PCT No.: PCT/JP2011/078793
§ 371 (c)(1),
(2), (4) Date: Sep. 27, 2013

(87) PCT Pub. No.: WO2012/132126
PCT Pub. Date: Oct. 4, 2012

(65) Prior Publication Data
US 2014/0008638 A1   Jan. 9, 2014

(30) Foreign Application Priority Data

Mar. 31, 2011   (JP) ................................. 2011-078362

(51) Int. Cl.
*H01L 51/54*   (2006.01)
*H01L 51/00*   (2006.01)
*H01L 51/50*   (2006.01)

(52) U.S. Cl.
CPC ............ *H01L 51/005* (2013.01); *H01L 51/008* (2013.01); *H01L 51/0072* (2013.01);
(Continued)

(58) Field of Classification Search
CPC . H01L 51/005; H01L 51/0072; H01L 51/008; H01L 51/5072; H01L 51/5092

USPC ..................... 257/40; 252/519.34; 438/46, 99
See application file for complete search history.

(56) References Cited

U.S. PATENT DOCUMENTS 4,426,366 A * 1/1984 McCandlish et al. ......... 423/365
7,510,782 B2 * 3/2009 Kato et al. ..................... 428/690
(Continued)

FOREIGN PATENT DOCUMENTS

EP           1954102 A1    8/2008
JP       2000-252072 A    9/2000
(Continued)

OTHER PUBLICATIONS

Extendede European Search Report Appln. No. PCT/JP2011078793; Issued Oct. 20, 2014.

*Primary Examiner* — Allan R Wilson
(74) *Attorney, Agent, or Firm* — Ladas & Parry LLP

(57) ABSTRACT

A main object of the present invention is to provide an organic EL element including an electron injection and transport layer containing an organic boron compound, which has excellent characteristics such as efficiency and service life. The present invention achieves the object mentioned above by providing an organic EL element including: an anode; a light emitting layer formed on the anode; an electron injection and transport layer that is formed on the light emitting layer, contains an organic boron compound, and has a crystalline structure; and a cathode formed on the electron injection and transport layer.

6 Claims, 4 Drawing Sheets

(52) U.S. Cl.
CPC ......... *H01L51/5072* (2013.01); *H01L 51/5092* (2013.01); *H01L 51/0003* (2013.01); *H01L 51/508* (2013.01)
USPC ........................... 257/40; 252/519.34; 438/99

(56) References Cited

U.S. PATENT DOCUMENTS

| | | | |
|---|---|---|---|
| 7,671,378 B2 * | 3/2010 | Katoda | 257/103 |
| 7,872,413 B2 * | 1/2011 | Shoda et al. | 313/504 |
| 2006/0083655 A1 | 4/2006 | Ito | |
| 2007/0167588 A1 * | 7/2007 | Kato et al. | 526/239 |
| 2009/0108735 A1 * | 4/2009 | Begley et al. | 313/504 |
| 2009/0243475 A1 * | 10/2009 | Shoda et al. | 313/504 |
| 2010/0200847 A1 * | 8/2010 | Kawakami et al. | 257/40 |

FOREIGN PATENT DOCUMENTS

| | | | |
|---|---|---|---|
| JP | 2001131185 A | * | 5/2001 |
| JP | 2001-284055 A | | 10/2001 |
| JP | 2001-342193 A | | 12/2001 |
| JP | 2002-075651 A | | 3/2002 |
| JP | 2003-031367 A | | 1/2003 |
| JP | 2003077671 A | | 3/2003 |
| JP | 2003-347061 A | | 12/2003 |
| JP | 2004-071395 A | | 3/2004 |
| JP | 2005-142122 A | | 6/2005 |
| JP | 2006-048986 A | | 2/2006 |
| JP | 2006-144112 A | | 6/2006 |
| JP | 2007088015 A | | 4/2007 |
| JP | 2009-155325 A | | 7/2009 |
| JP | 2010-198935 A | | 9/2010 |
| JP | 2011-020970 A | | 2/2011 |

* cited by examiner

ORGANIC ELECTROLUMINESCENT ELEMENT, METHOD FOR MANUFACTURING ORGANIC ELECTROLUMINESCENT ELEMENT, AND COATING LIQUID FOR ELECTRON INJECTION AND TRANSPORT LAYER

TECHNICAL FIELD

The present invention relates to an organic electroluminescent element with the use of an organic boron compound, and a manufacturing method therefor.

BACKGROUND ART

Organic electroluminescent (hereinafter, the term of electroluminescent may be abbreviated as EL) elements that interpose an organic layer between a pair of electrodes and applies a voltage between both electrodes to emit light have advantages such as high levels of visibility due to self-luminescent colors, excellent impact resistance because of being all-solid elements unlike liquid crystal elements, high response speeds, to be less affected by change in temperature, and wide viewing angles, and the use thereof as light emitting elements in display devices and lighting devices has been attracting attention.

As the organic EL elements, it is known that multiple layers of organic layers such as a hole injection and transport layer, a light emitting layer, and an electron injection and transport layer are stacked between an anode and a cathode. Vapor deposition methods and application methods have been widely adopted commonly as methods for forming the organic layer films.

The vapor deposition methods have the advantage of easily stacking layers and thus being able to construct a functionally separated multi-layer structure, thereby achieving increased efficiencies and lifetimes. However, it is difficult to uniformly control film thicknesses in large areas, and the formation of large-area organic layers has the problems of requiring long periods of time, thus resulting in a poor production efficiency, and requiring a large-scale vacuum system, thus resulting in high manufacturing cost. In addition, for example, in the case of forming an organic layer film by co-deposition of a host of an organic compound and a dopant of a metal or a metal compound, there is a possibility that the lifetime will be shortened due to the organic compound decomposed during the deposition, or decomposed and mixed in the film, because the deposition temperature of the metal or metal compound is higher than the deposition temperature of the organic compound.

It is to be noted that, Patent Literature 1 discloses the use of a metal borate or a metal organic boron compound as an electron injecting material that is comparable in dopant deposition temperature to organic compounds and relatively unlikely to damage organic compounds.

On the other hand, the application methods are advantageous in terms of cost, and also have the advantage of easily achieving larger areas, as compared with the vapor deposition methods. In addition, organic compounds are not decomposed during film formation as observed in the vapor deposition methods. Therefore, various methods for manufacturing organic EL elements have been proposed in which organic layers are formed by application methods. Above all, electron injection and transport layers formed on light emitting layers are formed mainly by vapor deposition methods, and studies have been thus made for forming electron injection and transport layers by application methods (see Patent Literatures 2 and 3). It is to be noted that in the application methods, materials have to be dissolved or dispersed in solvents in order to use coating liquids, materials for use in vapor deposition methods are not able to be directly diverted, and it is thus necessary to select materials appropriately.

For example, Patent Literature 2 proposes a method in which an electron injecting layer is formed by a wet process with the use of a non-ionic organic metal complex or a metal phthalocyanine. Patent Literature 3 proposes the formation of an electron injecting organic layer by application with the use of an organometallic salt or an organometallic complex compound. Moreover, although not for electron injection and transport layers, Patent Literature 4 proposes a method of forming a light emitting layer by a wet process with the use of a non-ionic organometallic complex as an electron transporting luminescent agent.

Then, in recent years, organic boron compounds have been attracting attention as materials for organic EL elements, because of being relatively stable against water and air.

For example, Patent Literature 5 proposes the use of an organic boron compound as a luminescent substance for emitting blue light of high color purity.

CITATION LIST

Patent Literature

Patent Literature 1: Japanese Patent Application Laid-Open No. 2005-142122
Patent Literature 2: Japanese Patent Application Laid-Open No. 2001-284055
Patent Literature 3: Japanese Patent Application Laid-Open No. 2003-347061
Patent Literature 4: Japanese Patent Application Laid-Open No. 2000-252072
Patent Literature 5: Japanese Patent No. 3969941

SUMMARY OF INVENTION

Technical Problem

The inventors have carried out various studies on characteristics of organic EL elements including an electron injection and transport layer containing an organic boron compound.

While Patent Literature 1 discloses, as described above, the use of a metal borate or a metal organic boron compound as an electron injecting material that is comparable in dopant deposition temperature to organic compounds and relatively unlikely to damage organic compounds, tetraboric acid and the like are supposed to have a deposition temperature of about 500° C., whereas tetraphenyl borate and the like are supposed to have a deposition temperature of about 300° C. to 400° C., and at the deposition temperatures which are still high, there is fear that the organic compounds will be decomposed during vapor deposition. In addition, the metal organic boron compound itself is also an organic substance, and there is thus a possibility that the compound will be decomposed during vapor deposition. In this case, the service life is unable to be improved.

The present invention has been achieved in view of the circumstances mentioned above, and a main object of the present invention is to provide an organic EL element comprising an electron injection and transport layer containing an organic boron compound, which has excellent characteristics such as efficiency and service life.

Solution to Problem

The inventors have found, as a result of earnest studies carried out for solving the problems mentioned above, that due to the fact that an amorphous film is obtained when a film of an organic boron compound is formed by a vapor deposition method, whereas a crystalline film is obtained when a film of an organic boron compound is formed by an application method, whether the state of the organic boron compound is crystalline or amorphous has an influence on element characteristics, thereby completing the present invention.

It is to be noted that Patent Literatures 2 and 3 disclose the formation of an electron injecting layer by an application method with the use of a non-ionic organometallic complex, metal phthalocyanine, or an organometallic complex compound, but fails to disclose the use of an organic boron compound at all. Moreover, Patent Literatures 1 to 5 all fail to consider the relationship between the crystalline or amorphous state of an organic layer and element characteristics.

More specifically, the present invention provides an organic EL element comprising: an anode; a light emitting layer formed on the anode; an electron injection and transport layer formed on the light emitting layer, containing an organic boron compound, and having a crystalline structure; and a cathode formed on the electron injection and transport layer.

According to the present invention, the electron injection and transport layer containing the organic boron compound has a crystalline structure, and can be thus improved in service life, as compared with amorphous films which have an organic boron compound decomposed or have a decomposed organic boron compound mixed therein. In addition, a high light emitting efficiency can be achieved, because the organic boron compound is used in the electron injection and transport layer. Therefore, it is possible to achieve a long-life and high-efficiency organic EL element.

In the present invention, the organic boron compound preferably contains an alkali metal. This is because the alkali metal has a favorable electron injecting property.

In addition, in the present invention, the electron injection and transport layer may further contain an electron transporting organic compound. In the case where the electron injection and transport layer contains the organic boron compound and the organic compound, a favorable carrier balance can be maintained even when the electron injection and transport layer is increased in film thickness, thus making it possible to ensure an adequate film thickness, to form a uniform film, and to increase the film strength. In addition, the use of the electron transporting organic compound can lower the driving voltage. Furthermore, in the case where an organic compound which has hole-blocking properties in addition to electron-transporting properties is added to the electron injection and transport layer, the charge recombination probability is improved, and the light emitting efficiency can be thus improved.

In this case, the electron transporting organic compound may be a polymer compound. While it is generally difficult to form films of polymer compounds by vapor deposition methods, it is also possible to use the polymer compound because the electron injection and transport layer which has a crystalline structure according to the present invention is formed by an application method. In addition, in the case where the electron injection and transport layer contains a polymer compound, migration of the organic boron compound into the light emitting layer is less likely to be caused, and the durability of the element is thus expected to be improved.

Furthermore, the present invention provides a method for manufacturing an organic EL element comprising: an anode; a light emitting layer formed on the anode; an electron injection and transport layer formed on the light emitting layer and containing an organic boron compound; and a cathode formed on the electron injection and transport layer; the method comprises an electron injection and transport layer forming step of applying a coating liquid for an electron injection and transport layer, which contains the organic boron compound and a solvent, to form an electron injection and transport layer.

According to the present invention, the electron injection and transport layer containing the organic boron compound is formed by an application method, and a crystalline film can be thus obtained, so that the service life can be improved, without having an organic boron compound decomposed or having a decomposed organic boron compound mixed in during film forming as in a case of using a vapor deposition method. In addition, a high light emitting efficiency can be achieved because the organic boron compound is used to form the electron injection and transport layer. Therefore, it is possible to obtain a long-life and high-efficiency organic EL element.

In the present invention, drying by heating is preferably carried out after applying the coating liquid for an electron injection and transport layer in the electron injection and transport layer forming step mentioned above. This is because the heating further improves the light emitting efficiency.

In addition, in the present invention, the light emitting layer and the cathode are preferably formed by an application method. The application method requires no expensive vacuum equipment as in vapor deposition methods, and can thus reduce the manufacturing cost.

Furthermore, the present invention provides a coating liquid for an electron injection and transport layer, which contains an organic boron compound and a solvent.

The formation of an electron injection and transport layer by an application method with the use of the coating liquid for an electron injection and transport layer according to the present invention makes it possible to obtain a long-life and high-efficiency organic EL element.

The coating liquid for an electron injection and transport layer according to the present invention may further contain an electron transporting organic compound. In the case of forming an electron injection and transport layer with the use of the coating liquid for an electron injection and transport layer, which contains the organic boron compound and the organic compound, it is possible to ensure an adequate film thickness, and a uniform film can be easily formed. In addition, the use of the electron transporting organic compound allows for low voltage drive.

In this case, the electron transporting organic compound may be a polymer compound. While it is generally difficult to form films of polymer compounds by vapor deposition methods, it is also possible to use the polymer compound because the electron injection and transport layer is formed by an application method in the present invention. In addition, the addition of the polymer compound to the coating liquid for an electron injection and transport layer makes migration of the organic boron compound to the light emitting layer less likely to be caused, and the durability of the element can be thus expected to be improved.

Advantageous Effects of Invention

The present invention produces the effect of being able to achieve a higher efficiency and a longer service life.

DESCRIPTION OF EMBODIMENTS

Figure 1:
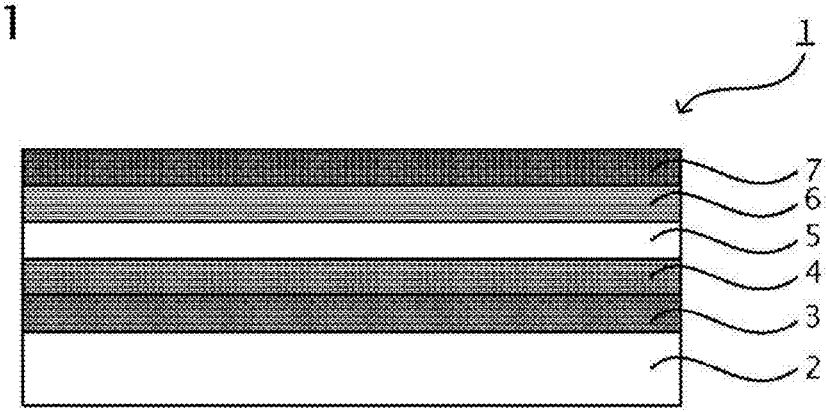
FIG. 1 is a schematic cross-sectional view illustrating an example of an organic EL element according to the present invention.

An organic EL element, a method for manufacturing an organic EL element, and a coating liquid for an electron injection and transport layer according to the present invention will be described below in detail.

A. Organic EL Element

First, an organic EL element according to the present invention will be described.

The organic EL element according to the present invention comprises: an anode; a light emitting layer formed on the anode; an electron injection and transport layer formed on the light emitting layer, contains an organic boron compound, and has a crystalline structure; and a cathode formed on the electron injection and transport layer.

The organic EL element according to the present invention will be described with reference to the drawing.

FIG. 1 is a schematic cross-sectional view illustrating an example of the organic EL element according to the present invention. As shown in FIG. 1, the organic EL element 1 comprises: a substrate 2; an anode 3 formed on the substrate 2; a hole injection/transport layer 4 formed on the anode 3; a light emitting layer 5 formed on the hole injection/transport layer 4; an electron injection and transport layer 6 that is formed on the light emitting layer 5, contains an organic boron compound, and has a crystalline structure; and a cathode 7 formed on the electron injection and transport layer 6.

In the present invention, the electron injection and transport layer containing an organic boron compound has a crystalline structure. When a layer of the organic boron compound is formed by a vapor deposition method herein, the deposited film is considered amorphous, because, during vapor deposition, the organic boron compound is decomposed, or the decomposed organic boron compound is mixed in the film. On the other hand, when a layer of the organic boron compound is formed by an application method, the deposited film is considered crystalline, because the organic boron compound can be prevented from being decomposed, and the decomposed organic boron compound can be prevented from being mixed. The crystalline film is presumed to have an electron transporting property improved, because the film has highly ordered atoms or molecules, and contains no impurities.

In addition, when the organic boron compound is film-formed by a vapor deposition method, there is a possibility that migration of decomposed products into the light emitting layer will be caused in driving the organic EL element to affect the light emitting characteristics of the element. On the other hand, when the organic boron compound is film-formed by an application method, migration is less likely to be caused in driving the organic EL element because there is no decomposed product, and it becomes possible to stably drive the element.

Moreover, there is a possibility that crystallization will be progressed by heat or electrical energy in the amorphous film to degrade the element characteristics, whereas the crystalline film is presumed to be advantageous for continuously driving the element because the change in state is small in the film.

Therefore, in the present invention, it is possible to achieve a long service life.

In addition, a high light emitting efficiency can be achieved, because the organic boron compound is used in the electron injection and transport layer. Therefore, in the present invention, it is possible to achieve a long-life, high-efficiency, high-performance organic EL element.

The respective components of the organic EL element according to the present invention will be described below.

1. Electron Injection and Transport Layer

The electron injection and transport layer according to the present invention is formed on the light emitting layer, contains an organic boron compound, and has a crystalline structure.

It is to be noted that it can be confirmed by an X-ray diffraction method that the electron injection and transport layer "has a crystalline structure". Specifically, depending on the presence or absence of a crystal peak found by the X-ray diffraction method, it can be confirmed that the layer has a crystalline structure (is crystalline) or is amorphous. In addition, the film can be also determined as having a crystalline structure (being crystalline) or being amorphous, with the use of an electron diffraction image obtained under a transmission electron microscope.

While the organic boron compound for use in the present invention is not particularly limited as long as the compound is composed of an organic anion containing boron and a cation, the compound is preferably represented by the following general formula (1).

[Chemical Formula 1]

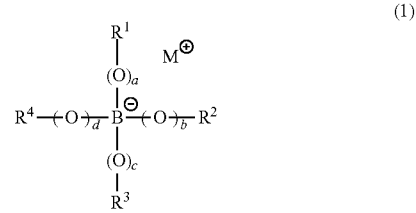

(1)

In the formula (1), M represents a metal element, $R^1$, $R^2$, $R^3$, and $R^4$ are aromatic ring groups, which may be identical or different, and "a", "b", "c", and "d" are each independently 0 or 1.

The aromatic ring groups are preferably aromatic hydrocarbon groups or heterocyclic groups.

The aromatic hydrocarbon groups may be monocyclic or polycyclic, which preferably have 6 to 12 carbon atoms. Above all, a phenyl group and a naphthyl group are preferred, and a phenyl group is particularly preferred.

The aromatic hydrocarbon groups may have substituents, examples of which include an alkyl group, an alkoxy group, an alkylthio group, a perfluoroalkyl group, a phenyl group, an aryloxy group, halogen atoms, an amino group, a cyano group, and a nitro group. The alkyl group and the perfluoroalkyl group may be linear or branched, which preferably have 1 to 10 carbon atoms, and specifically, examples thereof include a methyl group, an ethyl group, a propyl group, an isopropyl group, a butyl group, an isobutyl group, a sec-butyl group, a tert-butyl group, and a perfluoropropyl group.

The heterocyclic groups may be monocyclic or polycyclic, where one of the rings is preferably a five-membered ring or a six-membered ring. Example thereof include a pyrrole ring, an imidazole ring, a pyrazole ring, an oxazole ring, a thiazole ring, a triazole ring, an oxadiazole ring, a thiadiazole ring, a pyridine ring, a pyrimidine ring, a triazine ring, an indole ring, a benzoxazoline ring, a benzothiazoline ring, a quinoline ring, and a thiophene ring. The heterocyclic groups may have substituents on their rings, and examples of the substituents include an alkyl group, an alkoxy group, an alkylthio group, a phenyl group, an aryloxy group, an arylthio groups, halogen atoms, an amino group, a cyano group, and a nitro group. The alkyl group and the perfluoroalkyl group may be linear or branched, which preferably have 1 to 10 carbon atoms, and specifically, examples thereof include a methyl group, an ethyl group, a propyl group, an isopropyl group, a butyl group, an isobutyl group, a sec-butyl group, a tert-butyl group, and a perfluoropropyl group.

The heterocyclic groups are preferably a quinoline ring group specifically represented by the following general formula (2).

[Chemical Formula 2]

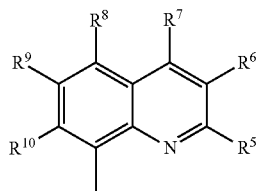

(2)

In the formula (2), $R^5$ to $R^{10}$ are each independently a hydrogen atom or the substituent mentioned above.

$M^+$ represents a monovalent cation, and M is a metal element. As the metal element, alkali metals of lithium (Li), sodium (Na), potassium (K), rubidium (Rb), and cesium (Cs) are preferred, and above all, lithium (Li), sodium (Na), and potassium (K) are more preferred. This is because the alkali metal has a favorable electron injecting property.

Examples of the organic boron compound represented by the formula (1) include, for example, lithium tetraphenylborate, sodium tetraphenylborate, potassium tetraphenylborate, rubidium tetraphenylborate, and cesium tetraphenylborate. In addition, the examples include compounds of tetraphenylborates with substituents added to phenyl groups of the tetraphenylborates, such as compounds of tetraphenylborates substituted with fluorine: lithium tetrakis-4-fluorophenylborate; sodium tetrakis-4-fluorophenylborate (aka: kalibor); potassium tetrakis-4-fluorophenylborate; rubidium tetrakis-4-fluorophenylborate; and cesium tetrakis-4-fluorophenylborate, or compounds of tetraphenylborates substituted with chlorine: lithium tetrakis-4-chlorophenylborate; sodium tetrakis-4-chlorophenylborate; potassium tetrakis-4-chlorophenylborate; rubidium tetrakis-4-chlorophenylborate; and cesium tetrakis-4-chlorophenylborate, or compounds substituted with a methyl group: lithium tetrakis-p-tolylborate; sodium tetrakis-p-tolylborate; potassium tetrakis-p-tolylborate; rubidium tetrakis-p-tolylborate; and cesium tetrakis-p-tolylborate, or compounds of tetraphenylborates substituted with a trifluoromethyl group: lithium tetrakis-4-fluoromethyl phenylborate; sodium tetrakis-4-fluoromethyl phenylborate; potassium tetrakis-4-fluoromethyl phenylborate; rubidium tetrakis-4-fluoromethyl phenylborate; and cesium tetrakis-4-fluoromethyl phenylborate. Furthermore, the examples can include lithium tetrakis-2-thienylborate, sodium tetrakis-2-thienylborate, potassium tetrakis-2-thienylborate, rubidium tetrakis-2-thienylborate, cesium tetrakis-2-thienylborate; lithium tetrakis-1-imidazolylborate, sodium tetrakis-1-imidazolylborate, potassium tetrakis-1-imidazolylborate, rubidium tetrakis-1-imidazolylborate, cesium tetrakis-1-imidazolylborate; and lithium tetra-(8-hydroxyquinolinato)borate (LiBq), sodium tetra-(8-hydroxyquinolinato)borate (NaBq), and potassium tetra-(8-hydroxyquinolinato)borate (KBq). Only one of these organic boron compounds may be used, or two or more thereof may be used in combination.

The organic boron compound represented by the formula (1) is preferably lithium tetra-(8-hydroxyquinolinato)borate or lithium tetraphenylborate specifically.

[Formula 3]

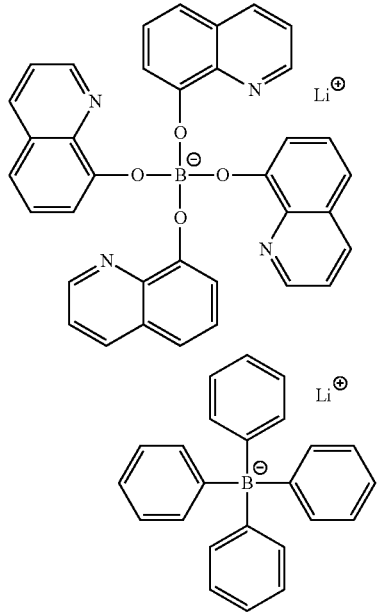

The electron injection and transport layer may further contain an organic compound in addition to the organic boron compound described above. More specifically, the electron injection and transport layer may be composed of only the organic boron compound, or may contain the organic boron compound and the organic compound. In the case where the electron injection and transport layer is composed of only the organic boron compound, there is a possibility that when the electron injection and transport layer is increased in film thickness, the carrier balance will be lowered to degrade the element performance, whereas a favorable carrier balance can be maintained even when the electron injection and transport layer is increased in film thickness in the case where the electron injection and transport layer contains the organic boron compound and the organic compound. Therefore, in the case where the electron injection and transport layer contains the organic boron compound and the organic compound, it is possible to ensure an adequate film thickness, thereby making it easy to form a uniform film, and making it possible to increase the film strength. In addition, when the organic boron compound is likely to aggregated, the electron injection and transport layer further containing the organic compound is also expected to suppress the aggregation of the organic boron compound and achieve a uniform film.

While the organic compound for use in the electron injection and transport layer is not particularly limited as long as the compound is able to form the electron injection and transport layer as a thick film while maintaining the carrier balance, the compound is preferably, above all, an electron transporting organic compound. This is because the use of the electron transporting organic compound can lower the driving voltage. Furthermore, in the case where the electron transporting organic compound added has hole-blocking properties, the charge recombination probability is improved, and the light emitting efficiency can be thus improved.

The electron transporting organic material may be low molecular weight compounds or high molecular weight compounds. While it is generally difficult to form films of polymer compounds by vapor deposition methods, it is also possible to use the polymer compound because the electron injection and transport layer which has a crystalline structure according to the present invention is formed by an application method. In addition, in the case where the electron injection and transport layer contains a polymer compound, migration of the organic boron compound into the light emitting layer is less likely to be caused, and the durability of the element is thus expected to be improved.

It is to be noted that the "low molecular weight compounds" refer to compounds without having any repeating units. The low molecular weight compounds may have a weight average molecular weight of 1000 or less.

The "high molecular weight compounds" refer to compounds having any repeating units. The high molecular weight compounds may have a weight average molecular weight of 1000 or more. The high molecular weight compounds may be compounds having a smaller number of repeating units, such as oligomers, as long as the compounds have any repeating units.

In addition, while the electron transporting organic compound is not particularly limited, the compound is preferably an aromatic compound, and examples of the compound include, naphthalene, anthracene, tetracene, pyrene, chrysene, coronene, naphthacene, phenanthrene, acridine, quinoline, quinoxaline, perylene, phthaloperylene, naphthaloperylene, perynone, phthaloperynone, naphthaloperynone, oxadiazole, triazole, thiadiazole, fluorene, fluorescein, diphenyl butadiene, tetraphenylbutadiene, bisbenzoxazoline, bisstyryl, pyrazine, cyclopentadiene, silole, oxine(quinolinol), aminoquinoline, diphenylethylene, vinylanthracene, diaminocarbazole, pyran, thiopyran, polymethine, merocyanine, quinacridone, Rubrene, phenanthroline, bathophenanthroline, phenanthridine, pyridine, bipyridine, terpyridine, and derivatives thereof. In addition, the examples can include metal complexes such as tris(8-quinolinolato)aluminum ($Alq_3$) and bis(2-methyl-8-quinolinolato)(p-phenylphenolato)aluminum (BAlq). Only one of these organic boron compounds may be used, or two or more thereof may be used in combination.

In the case where the electron injection and transport layer contains the organic boron compound and the organic compound, the content of the organic boron compound in the electron injection and transport layer is not particularly limited as long as the carrier balance can be maintained, and can be set within the range of 1 mass % to 99 mass %.

The film thickness of the electron injection and transport layer is not particularly limited as long as the thickness adequately achieves the function of stabilizing the injection of electrons into the light emitting layer, and selected appropriately depending on the composition of the electron injection and transport layer. In the case where the electron injection and transport layer is composed of only the organic boron compound, the film thickness of the electron injection and transport layer is preferably within the range of 0.1 nm to 100 nm. In the case where the electron injection and transport layer contains the organic boron compound and the organic compound, the film thickness of the electron injection and transport layer is preferably within the range of 0.1 nm to 500 nm. This is because there is possibility that the decreased film thickness of the electron injection and transport layer will fail to achieve adequate electron injecting properties, whereas the increased film thickness thereof will decrease the light emitting efficiency.

The method for forming the electron injection and transport layer is preferably an application method. It is to be noted that the application method refers to a method with the use of a coating liquid. The method for forming the electron injection and transport layer will be described in detail later in the section of "B. Method for Manufacturing Organic EL Element", and the description will be thus omitted here.

2. Light Emitting Layer

The light emitting layer in the present invention is formed on the anode.

Materials for use in the light emitting layer include, for example, light emitting materials such as dye materials, metal complex materials, and polymer materials.

The dye materials include cyclopentadiene derivatives, tetraphenylbutadiene derivatives, triphenylamine derivatives, oxadiazole derivatives, pyrazolo quinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumanyl amine derivatives, oxadiazole dimers, and pyrazoline dimers.

The metal complex materials include metal complexes having Al, Zn, Be, or the like; a rare-earth metal such as Tb, Eu, or Dy; or a transition metal such as Pt or Ir as a central metal, and having an oxadiazole, thiadiazole, phenylpyridine, phenylbenzimidazole, or quinoline structure as a ligand, such as aluminum quinolinol complexes, benzoquinolinol beryllium complexes, benzoxazole zinc complexes, benzothiazole zinc complexes, azomethyl zinc complexes, porphyrin zinc complexes, and europium complexes.

The polymer materials can include polyparaphenylenevinylene derivatives, polythiophene derivatives, polyparaphenylene derivatives, polysilane derivatives, polyacetylene derivatives, polyvinylcarbazole, polyfluorene derivatives, polyquinoxaline derivatives, and copolymers thereof. In addition, the polymer materials can include materials obtained by polymerization of the dye materials and metal complex materials mentioned above.

In the light emitting layer, a doping agent may be added for purposes such as improvements in light emitting efficiency and changes in emission wavelength. Examples of this doping agent include perylene derivatives, coumarin derivatives, rubrene derivatives, quinacridone derivatives, squarium derivatives, porphyrin derivatives, styryl dyes, tetracene derivatives, pyrazoline derivatives, decacyclene, phenoxazone, quinoxaline derivatives, carbazole derivatives, and fluorene derivatives.

The thickness of the light emitting layer is not particularly limited as long as the thickness can provide the field for recombination of electrons and holes to develop the light emitting function, and can be set to about 1 nm to 500 nm.

The light emitting layer may be formed in a pattern form so as to have light emitting sections of multiple colors such as red, green, and blue. Thus, an organic EL panel can be achieved which is capable of color display.

As the method for forming the light emitting layer, common methods for forming the light emitting layer can be employed, and both application methods and vapor deposition methods can be used. The application methods include, for example, an ink-jet method, a spin coating method, a casting method, a dipping method, a barcode method, a blade coating method, a roll coating method, a spray coating method, a gravure coating method, a flexographic printing method, a gravure printing method, and a screen printing method. The vapor deposition methods, for which physical vapor deposition methods (PVD methods) can be used, include, for example, vacuum deposition methods and sputtering methods.

In the case of forming the light emitting layer by an application method, no expensive vacuum equipment as in vapor deposition methods is required, which is advantageous in terms of cost.

3. Anode

The anode for use in the present invention may or may not have a light transmission property, and is selected appropriately depending on the light extraction surface. In the case of extracting light from the anode side, the anode serves as a transparent electrode.

The anode is preferably low in resistance and metal materials as conductive materials are used commonly, while organic compounds or inorganic compounds may also be used.

As the material for use in the anode, it is preferable to use a conductive material that is large in work function so that holes are easily injected. Examples of the conductive material include, metals such as Au, Ta, W, Pt, Ni, Pd, Cr, Cu, and Mo, alkali metals, and alkali-earth metals; oxides of these metals; alloys such as Al alloys, e.g., AlLi, AlCa, and AlMg, Mg alloys, e.g., MgAg, Ni alloys, Cr alloys, alloys of alkali metals, and alloys of alkali-earth metals; inorganic oxides such as indium tin oxide (ITO), indium zinc oxide (IZO), zinc oxide (ZnO), and indium oxide; conductive polymers such as metal-doped polythiophene, polyaniline, polyacetylene, polyalkylthiophene derivatives, and polysilane derivatives; and α-Si and α-SiC. These conductive materials may be used by themselves, or two or more thereof may be used in combination. In the case of using two or more of the conductive materials, layers composed of the respective materials may be stacked.

As the method for forming a film of the anode, common methods for forming electrodes can be used, and both dry processes and wet processes can be applied. The dry processes include, for example, physical vapor deposition (PVD) methods such as a vacuum deposition method, a sputtering method, an EB deposition method, and an ion plating method, or chemical vapor deposition (CVD) methods. In addition, when the anode is formed in a pattern form, the patterning method is not particularly limited as long as the method can form the anode in a desired pattern with a high degree of accuracy, and examples of the method can include a photolithography method.

4. Cathode

The cathode for use in the present invention may or may not have a light transmission property, and is selected appropriately depending on the light extraction surface. In the case of extracting light from the cathode side, the cathode serves as a transparent electrode.

The cathode is preferably low in resistance and metal materials as conductive materials are used commonly, while organic compounds or inorganic compounds may also be used.

As the material for use in the cathode, it is preferable to use a conductive material that is small in work function so that electrons are easily injected. Examples of the material include, metals such as Li, Ca, Mg, Al, and In, and alloys such as Mg alloys, e.g., MgAg, Al alloys, e.g., AlLi, AlCa, and AlMg, and alloys of alkali metals such as Li, Cs, Ba, Sr, and Ca and alloys of alkali-earth metals. In addition, metals such as Au, Ag, Pd, Ni, and Cu can be also used.

The film forming method and patterning method for the cathode can be the same as the film forming method and patterning method for the anode described above.

In the case of forming the cathode by a wet process, no expensive equipment as in dry processes is required, which is advantageous in terms of cost. Examples of the wet process include, a method of applying a conductive paste with metal particles such as Au, Ag, Pd, Ni, and Cu dispersed in a resin and curing the resin; a method of applying a conductive paste with metal particles of a low melting point metal dispersed in a resin and melting and cooling the low melting point metal; a method of applying a paste-like metal including a liquid metal that is liquid at normal temperature; a method of stacking a substrate partitioning the perimeter so as to provide a predetermined depth and including a storage section for holding a low melting point metal inside the partition, and a stacked body having layers such as an anode, a light emitting layer, an electron injection and transport layer stacked, such that the storage section and the electron injection and transport layer are opposed, and sealing a low melting point metal or a liquid metal that is liquid at normal temperature in the storage section; and a method of partitioning the perimeter of the space sandwiched between an electron injection and transport layer and substrate placed to be opposed to the electron injection and transport layer, forming a gap provided with one or more holes leading to the outside, and injecting a low melting point metal or a liquid metal that is liquid at normal temperature through the holes into the gap.

Above all, the methods are preferred which use the low melting point metal or the liquid metal that is liquid at normal temperature.

The method using the low melting point metal and the method using the liquid metal that is liquid at normal temperature will be separately described below.

(1) Method Using Low Melting Point Metal

The low melting point metal may be a single element metal or an alloy, and is not particularly limited as long as a common low melting point metal is used.

It is to be noted that the "alloy" in this specification means an apparently homogeneous metal composed of two or more metals, for which the metal bond formed between dissimilar metals is not necessarily required.

The melting point of the low melting point metal is preferably 30° C. higher than the glass transition temperatures of organic layers such as a light emitting layer, an electron injection and transport layer, and a hole injection/transport layer, and specifically, preferably 70° C. or higher and 160° C. or lower. If the melting point of the low melting point metal is over 30° C. higher than the glass transition temperatures of the organic layers, there is a possibility that serious damage will be caused to the organic layers. In addition, in order to use the organic EL element stably even under high-temperature environments such as in vehicles in midsummer, the melting point of the metal or alloy constituting the electrode has a lower limit of 70° C. for practical purposes. If the melting point of the low melting point metal is lower than 70° C., there is concern about thermal melting. On the other hand, if the melting point of the low melting point metal exceeds 160° C., there is a possibility that great damage will be caused to the organic layers during the formation of the electrode.

Preferred low melting point metals include Bi alloys and InSn alloys. The Bi alloys preferably contain Bi, and at least one metal selected from the group consisting of Sn, Pb, Cd, Sb, In, and Ag. Specifically, examples thereof include the low melting point metals shown in Table 1.

TABLE 1

| No. | Alloy Constituent (mass %) | Melting Point (° C.) |
|---|---|---|
| 1 | Bi—Pb—Sn (50:25:25) | 93 |
| 2 | Bi—Pb—Sn (50.0:31.2:18.8) | 94 |
| 3 | Bi—Pb—Sn (50.0:28.0:22.0) | 100 |
| 4 | Bi—Pb—Sn—Cd (40.0:40.0:11.5:8.5) | 130 |
| 5 | Bi—Pb—Sn—Sb (47.7:33.2:18.8:0.3) | 130 |
| 6 | Bi—Pb—Sn—Cd (50.0:26.7:13.3:10.0) | 70 |
| 7 | Bi—Pb—Sn—Cd (50.0:25.0:12.5:12.5) | 72 |
| 8 | Bi—Cd (60.0:40.0) | 144 |
| 9 | Bi—Cd—In (60.0:35.5:5.0) | 137 |
| 10 | Bi—Sn—Ag (57.0:42.0:0.5) | 194 |
| 11 | Sn—Bi (57.0:43.0) | 139 |
| 12 | In—Sn (52.0:48.0) | 117 |

It is to be noted that the alloy compositions in Table 1 mean compositions based on the prepared weights of respective metal constituents weighed in advance, or on the measurement results obtained by an X-ray diffraction method, an XPS method, or other appropriate method.

Alkali metals or alkali-earth metals may be added to the low melting point metal, in order to enhance the electron injecting function. The alkali metals or alkali-earth metals are preferably selected from the group consisting of Ca, Li, Cs, Mg, and Sr.

The additive amount of the alkali metals or alkali-earth metals preferably falls within the range of 0.01% to 1% in terms of ratio by volume or ratio by weight, and above all, within the range of 0.05% to 0.5% with respect to the low melting point metal as a matrix. As long as the additive amount of the alkali metals or alkali-earth metals falls within the range mentioned above, the melting point of the low melting point metal undergoes no change.

The method for having the alkali metal or alkali-earth metal contained in the low melting point metal as a matrix can be achieved by a common method for handling atmospheric combustible metals. For example, a method can be used in which the low melting point metal and the alkali metal or alkali-earth metal are melted, mixed, and cooled in a heating furnace or a vacuum heating furnace with an atmosphere replaced by an inert gas such as nitrogen or argon.

As the method for applying the conductive paste with metal particles of the low melting point metal dispersed in a resin, for example, a screen printing method is used.

It is to be noted that the same method as described in, for example, Japanese Patent Application Laid-Open No. 2005-285732 can be adopted for the method for forming electrodes with the use of low melting point metal, such as: methods of applying a conductive paste with metal particles of the low melting point metal dispersed in a resin, and melting and cooling the low melting point metal; the method of stacking a substrate partitioning the perimeter so as to provide a predetermined depth and including a storage section for holding a low melting point metal inside the partition, and a stacked body of layers such as an anode, a light emitting layer, and an electron injection and transport layer stacked, such that the storage section and the electron injection and transport layer are opposed, and sealing a low melting point metal in the storage section; and the method of partitioning the perimeter of the space sandwiched between an electron injection and transport layer and substrate placed to be opposed to the electron injection and transport layer, forming a gap provided with one or more holes leading to the outside, and injecting a low melting point metal through the holes into the gap.

(2) Method Using Liquid Metal that is Liquid at Normal Temperature

The liquid metal refers to a metal in a liquid state at normal temperature (5° C. to 45° C. as a guide), which exhibits sufficient fluidity at normal temperature or relatively low temperatures up to about 50° C. even if heated. The melting point of the liquid metal is preferably 50° C. or lower.

It is possible to form a film of the liquid metal by a wet process on heating at normal temperature or low temperature, and electrodes in any shape can be formed by the wet process, without relying on any dry processes such as vapor deposition. Therefore, the manufacturing cost is inexpensive as compared with dry processes, further, the electrode size is not restricted by the size of a vapor deposition apparatus in the manufacturing process, and the increase in the size of the organic EL element and the reduction in the manufacturing cost thereof can be thus achieved.

In addition, the electrode composed of the liquid metal is not disconnected, and even when the electrode is disconnected by pressure or the like, the electrode is again integrally connected when fluidity is provided by leaving or inclining the organic EL element on heating at normal temperature or low temperature, so the problem of disconnection does not occur practically. Therefore, a highly reliable organic EL element is achieved which causes no electrode disconnection, and can be preferably used as a flexible organic EL element in the case of using a flexible substrate composed of resin.

The liquid metal may be a single element metal or an alloy, which is not particularly limited as long as the metal is liquid at normal temperature. Above all, Ga or a Ga alloy is preferably used in terms of fluidity and low toxicity at normal temperature.

The Ga alloy contains Ga as its main constituent, and Ga preferably accounts for 40 mass %, and further preferably 50 mass % of the metals constituting the Ga alloy.

The single Ga element with a melting point of 30° C. and a boiling point of 2400° C. is liquid over a wide range of temperatures from room temperature to high temperature. Ga alloys containing at least one metal of In, Sn, and Zn as an essential constituent along with Ga can be used as metals that can keep a liquid state at lower temperatures. Specifically, the metals include the Ga and Ga alloys shown in Table 2.

TABLE 2

| No. | Alloy Constituent (mass %) | Melting Point (° C.) |
|---|---|---|
| 1 | Ga (100) | 30 |
| 2 | Ga—In (75.5:24.5) | 16 |
| 3 | Ga—In—Sn (62.0:25.0:13.0) | 5 |

TABLE 2-continued

| No. | Alloy Constituent (mass %) | Melting Point (° C.) |
|---|---|---|
| 4 | Ga—In—Zn (67.0:29.0:4.0) | 13 |
| 5 | Ga—Sn (92.0:8.0) | 20 |
| 6 | Ga—Zn (95.0:5.0) | 25 |

It is to be noted that the alloy compositions in Table 2 mean compositions based on the prepared weights of respective metal constituents weighed in advance, or on the measurement results obtained by an X-ray diffraction method, an XPS method, or other appropriate method.

If necessary, other constituents may be added to the liquid metal. For example, in order to improve the electron injection efficiency, at least one metal selected from alkali metals and alkali-earth metals can be added as a substance that is low in work function. The alkali metal or alkali-earth metal is preferably at least one metal selected from Ca, Li, Na, K, Mg, Rb, Cs, Ba, Be, and Sr.

Alkali metals and alkali-earth metals are classified in terms of the melting point broadly into a low melting point group: Li (180° C.); Na (98° C.); K (64° C.); Rb (39° C.); and Cs (29° C.) and a high melting point group: Ca (839° C.); Mg (650° C.); Ba (725° C.); Be (1284° C.); and Sr (770° C.). The alkali metal or alkali-earth metal is hazardous because of its strong oxidization-combustibility in the atmosphere, and thus preferably handled typically in a glove box with an atmosphere replaced by an inert gas.

The low melting point group mentioned above can be melted by heating in a glove box with relative safety, and can be thus weighed and mixed in the Ga or Ga alloy. On the other hand, even in a glove box, it is highly hazardous for the high melting point group mentioned above to be melted by heating and mixed directly in the Ga or Ga alloy, because of a large amount of heat. For this reason, an alloy with other metal is preferably prepared in advance in a vacuum melting furnace that can prevent combustion, and then handled in the safe condition.

Alkali metals and alkali-earth metals are all preferred because the metals are low in work function, and can develop a high electron injecting function, and Ca (work function: 2.87 eV), Li (work function: 2.4 eV), Na (work function: 2.36 eV), K (work function: 2.28 eV), Mg (work function: 3.66 eV), Rb (work function: 2.16 eV), Cs (work function: 2.14 eV), Ba (work function: 2.52 eV), Be (work function: 2.45 eV), and Sr (work function: 2.59 eV) can be preferably used. It is to be noted that the values of "work function" for each element are based on the data listed on p. 4729 of 'J. Appl. Phys. Vol. 48' (1977), and data actually measured by an ionization potential measuring apparatus.

In the case of applying a paste-like metal containing the liquid metal, among alkali metals and alkali-earth metals, Ca is particularly preferred because a large amount of Ca can be easily mixed in the Ga or Ga alloy. It is considered that Ca is very higher in molar volume than other metals, and able to blend in large amounts into the Ga or Ga alloys. In addition, Ca can easily achieve an electrode for a high power conversion efficiency, and also a long element lifetime. Further, examples of the molar volumes for each metal are listed below.

Ca $26.2 \times 10^3$ ($m^3$/mol)
Li $13.0 \times 10^{-6}$ ($m^3$/mol)
Na $23.8 \times 10^{-3}$ ($m^3$/mol)
K $45.9 \times 10^{-3}$ ($m^3$/mol)
Mg $14.0 \times 10^{-3}$ ($m^3$/mol)
Rb $55.8 \times 10^{-6}$ ($m^3$/mol)
Cs $70.9 \times 10^{-3}$ ($m^3$/mol)
Ba $38.2 \times 10^{-3}$ ($m^3$/mol)
Be $4.9 \times 10^{-3}$ ($m^3$/mol)
Sr $33.9 \times 10^{-3}$ ($m^3$/mol)

The additive amount of the alkali metal or alkali-earth metal for developing a high electron injecting performance preferably falls within the range of 0.01% to 1%, and further preferably within the range of 0.05% to 0.5% in terms of ratio by volume or ratio by weight with respect to the Ga or Ga alloy as a matrix. As long as the additive amount falls within the range mentioned above, the melting point of the Ga or Ga alloy undergoes no change.

In addition, in the case of applying the paste-like metal containing the liquid metal, it is preferable to contain 5 mass % to 30 mass % of Ca, in particular, in order to make the liquid metal in a strongly viscous paste form. The Ca concentration in the range mentioned above can achieve a viscosity of 5 Pa·s to 100 Pa·s suitable for various types of printing methods, and develop, as an electrode, an adequate electron injecting function required for the organic EL element. The viscosity depending on the Ca concentration, as well as somewhat depending on the type of the Ga alloy and the type of a metal with a melting point of 300° C. or lower as described later.

In the case described above, where at least one metal selected from alkali metals and alkali-earth metals other than Ca is contained along with Ca, the additive amount of the alkali metals and alkali-earth metals other than Ca is preferably 1 mass % or less, and more preferably within the range of 0.05 mass % to 2 mass %. As long as the additive amount falls within the range mentioned above, the paste property of the paste-like metal is not affected.

In or Sn is preferred as the other metal forming an alloy with the alkali metal or alkali-earth metal. The alloy of the alkali metal or alkali-earth metal with In or Sn is melted in the Ga or Ga alloy at room temperature in the atmosphere, and can be thus easily weighed and mixed. In addition, In or Sn is easily melted in Ga, and thus, even when the alloy described above is dissolved in the Ga or Ga alloy, a homogeneous paste-like liquid metal can be produced without separating In or Sn as a solid phase.

While it is obvious that the alkali metals and alkali-earth metals of the high melting point group can be even also alloyed with the Ga or Ga alloy directly in a vacuum melting furnace, it is easier to change the conditions, such as to adjust the concentrations, when the alloy of the alkali metal or alkali-earth metal with In or Sn is prepared in advance, and mixed in the Ga or Ga alloy.

The Ga alloy obtained by this method turns to liquid at a lower temperature (has a lower melting point) than a single Ga element, thus making the handling easier.

Conventionally, alkali metals or alkali-earth metals have been used only in film-forming processes under vacuum, because the metals are strongly oxidizable and combustible, unstable, and difficult to handle. In contrast, in the method described above, the alkali metal or alkali-earth metal is quite easy to handle, because the metal can be mixed in the liquid metal, and used in a wet process to form an electrode.

The method for having the alkali metal or alkali-earth metal contained in the Ga or Ga alloy as a matrix can be achieved by a common method for handling atmospheric combustible metals. For example, a method can be used in which the Ga or Ga alloy and the alkali metal or alkali-earth metal are melted, mixed, and cooled in a heating furnace or a vacuum heating furnace with an atmosphere replaced by an inert gas such as nitrogen or argon.

In the case of applying the paste-like metal containing the liquid metal, the paste-like metal preferably further contains a metal with a melting point of 300° C. or lower, and turns to paste at a temperature not lower than the softening point while the paste-like metal is solid at normal temperature. As described above, the addition of the metal with a melting point of 300° C. or lower to the liquid metal produces a paste-like metal that turns to paste at a temperature not lower than the softening point while the paste-like metal is solid at normal temperature.

The paste-like metal is solid at normal temperature. On heating, the paste-like metal starts to be softened at a given temperature, and further heating, undergoes a transition to the liquid state through a viscous paste.

Examples of the metal with a melting point of 300° C. or lower include In, Sn, Bi, or alloys containing these metals as main constituents. Among these metals, InSn can be preferably used. Table 3 shows examples of the metal with a melting point of 300° C. or lower.

TABLE 3

| No. | Alloy Constituent (mass %) | Melting Point (° C.) |
| --- | --- | --- |
| 1 | In (100) | 160 |
| 2 | In—Sn (52.0:48.0) | 117 |
| 3 | Sn (100) | 230 |
| 4 | Sn—Bi (57.0:43.0) | 139 |
| 5 | Sn—Ag (96.5:3.5) | 221 |
| 6 | Bi (100) | 270 |
| 7 | Bi—Pb—Sn (50.0:28.0:22.0) | 100 |
| 8 | Bi—Pb—Sn—Cd (40.0:40.0:11.5:8.5) | 130 |
| 9 | Bi—Pb—Sn—Sb (47.7:33.2:18.8:0.3) | 130 |
| 10 | Bi—Cd (60.0:40.0) | 144 |
| 11 | Bi—Cd—In (60.0:35.5:5.0) | 137 |
| 12 | Bi—Sn—Ag (57.0:42.0:0.5) | 194 |

The paste-like metal turns to a completely liquid state at such high temperatures that further exceeds the softening point. Therefore, the paste is considered as a state in a viscous range intermediate between the liquid state and the solid state. The paste-like metal is preferably paste in the temperature range of 5° C. or more. With this range of temperature width, the organic EL element can be manufactured in a stable manner.

In addition, the softening point of the paste-like metal is preferably 50° C. or higher. If the softening point is lower than 50° C., the formed electrode may be melted and peeled by environmental changes or the like in some cases.

In order to add the metal with a melting point of 300° C. or lower, the alloy of the alkali metal or alkali-earth metal with In or Sn is dissolved in the Ga or Ga alloy to form a paste-like liquid metal, and the metal with a melting point of 300° C. or lower is then mixed into the paste-like liquid metal by heating to the temperature at which the metal with a melting point of 300° C. or lower is melted.

As the method for applying the paste-like metal containing the liquid metal, a screen printing method, a metal mask method, or a dispenser application method is used, for example.

It is to be noted that the paste-like metal refers metal solely in a paste form without containing any resin. The electrode formed with the use of the paste-like metal has an excellent electron injecting function, because of containing no resin.

It is to be noted that the same methods as described in, for example, Japanese Patent Application Laid-Open No. 2006-048986 (Japanese Patent No. 4544937) and Japanese Patent Application Laid-Open No. 2006-144112 can be adopted for methods for forming electrodes with the use of a liquid metal that is liquid at normal temperature, such as: the method of applying the paste-like metal containing a liquid metal that is liquid at normal temperature; the method of stacking a substrate partitioning the perimeter so as to provide a predetermined depth and including a storage section for holding a low melting point metal inside the partition, and a stacked body of an anode, a light emitting layer, an electron injection and transport layer, etc. stacked, such that the storage section and the electron injection and transport layer are opposed, and sealing a liquid metal that is liquid at normal temperature in the storage section; and the method of partitioning the perimeter of the space sandwiched between an electron injection and transport layer and substrate placed to be opposed to the electron injection and transport layer, forming a gap provided with one or more holes leading to the outside, and injecting a liquid metal that is liquid at normal temperature through the holes into the gap.

5. Electron Transporting Layer

In the present invention, an electron transporting layer may be formed between the light emitting layer and the electron injection and transport layer.

While the material for use in the electron transporting layer is not particularly limited as long as the material can stably transport electrons injected from the cathode into the light emitting layer, above all, the material is preferably high in electron mobility, and further, preferably able to prevent the penetration of holes moving from the anode. This is because the recombination efficiency of holes and electrons can be increased in the light emitting layer. Examples of the material can include, for example, metal complexes such as bathocuproine, bathophenanthroline, phenanthroline derivatives, triazole derivatives, oxadiazole derivatives, and tris(8-quinolinolato)aluminum ($Alq_3$).

The thickness of the electron transport layer is not particularly limited as long as the thickness adequately achieves the electron transporting function.

In addition, the method for forming the electron transporting layer is the same as the method for forming the light emitting layer.

6. Electron Injecting Layer

In the present invention, an electron injecting layer may be formed between the electron injection and transport layer and the cathode.

The material for use in the electron injecting layer is not particularly limited as long as the material can stabilize the injection of electrons into the light emitting layer, and an aluminum-lithium alloy, lithium, calcium, cesium, strontium, lithium fluoride, calcium fluoride, cesium fluoride, magnesium fluoride, strontium fluoride, barium fluoride, magnesium oxide, strontium oxide, polymethylmethacrylate, and sodium polystyrenesulfonate can be used, for example.

In addition, a metal-doped layer can be formed from an electron transporting organic material doped with an alkali metal or an alkali-earth metal, and used as the electron injecting layer. While the electron transporting organic material is not particularly limited, examples thereof can include bathocuproine, bathophenanthroline, and phenanthroline derivatives, and examples of the doping metal include Li, Cs, Ba, and Sr.

The thickness of the electron injecting layer is not particularly limited as long as the thickness adequately achieves the electron injecting function.

In addition, the method for forming the electron injecting layer is the same as the method for forming the light emitting layer mentioned above.

7. Hole Injection/Transporting Layer

In the present invention, a hole injection/transport layer may be formed between the anode and the light emitting layer. Examples of the hole injection/transport layer include a hole injecting layer that has a hole injecting function, a hole transporting layer that has a hole transporting function, and a layer that has both a hole injecting function and a hole transporting function.

The material for use in the hole injection/transport layer is not particularly limited as long as the material can stabilize the injection of holes into the light emitting layer, and phenylamines, starburst-type amines, phthalocyanines, oxides such as vanadium oxide, molybdenum oxide, ruthenium oxide, aluminum oxide, and titanium oxide, amorphous carbon, conductive polymers such as polyaniline, polythiophene, polyphenylenevinylene, and derivatives thereof can be used in addition to the compounds exemplified as the light emitting material for the light emitting layer. Specifically, examples of the material include bis(N-((1-naphthyl)-N-phenyl)benzidine (α-NPD) and poly(3,4ethylenedioxythiophene)-polystyrene sulfonate (PEDOT-PSS).

While the thickness of the hole injection/transport layer is not particularly limited as long as the thickness adequately achieves the hole injecting function and the hole transporting function, specifically, the thickness preferably falls within the range of 0.5 nm to 1000 nm, and above all, within the range of 10 nm to 500 nm.

The method for forming the hole injection/transport layer can be the same as the method for forming the light emitting layer mentioned above.

8. Substrate

In the present invention, the anode, the light emitting layer, the electron injection and transport layer, the cathode, etc. may be stacked on a substrate. The substrate for use in the present invention is intended to support members such as the anode, the light emitting layer, the electron injection and transport layer, and the cathode. In the case where the anode has a predetermined strength, the anode itself can serve as a support, and the anode may be formed on a substrate that has a predetermined strength.

The substrate may or may not have a light transmission property, and the substrate is selected appropriately depending on the light extraction surface. In the case of extracting light from the substrate side, the substrate serves as a transparent substrate.

For example, glass substrates such as soda-lime glass, alkali glass, lead alkali glass, borosilicate glass, aluminosilicate glass, and silica glass, and resin substrates that are able to be formed into films can be used as the substrate.

The resins for use in the resin substrates preferably have relatively high solvent resistance and heat resistance. Specifically, the resins include fluorine resins, polyethylene, polypropylene, polyvinyl chloride, polyvinyl fluoride, polystyrene, ABS resins, polyamide, polyacetal, polyester, polycarbonate, modified polyphenylene ether, polysulfone, polyarylate, polyetherimide, polyethersulfone, polyamideimide, polyimide, polyphenylene sulfide, liquid crystalline polyester, polyethylene terephthalate, polybutylene terephthalate, polyethylene naphthalate, polyoxymethylene, polyethersulfone, polyetheretherketone, polyarylate, acrylonitrile-styrene resins, phenolic resins, urea resins, melamine resins, unsaturated polyester resins, epoxy resins, polyurethane, silicone resins, and amorphous polyolefin. In addition, copolymers of these resins can be also used. Furthermore, if necessary, substrates may be also used which have gas barrier properties for blocking gases such as moisture and oxygen.

The thickness of the substrate is appropriately selected depending on the constituent material of the substrate and the use application of the organic EL element. Specifically, the substrate has a thickness of about 0.005 mm to 5 mm.

9. Other Configuration

The organic EL element according to the present invention may have any other constituent members, besides the constituent members described above.

For example, in the case where the anode is formed in a pattern on the substrate, an insulating layer may be formed so as to cover ends of the anode pattern. In addition, the insulating layer may be formed so as to define pixels. As the insulating layer, insulating layers can be used which are common in organic EL elements.

In addition, in the case of using the organic EL element according to the present invention for a display device, TFT elements may be formed on the substrate. As the TFT elements, TFT elements can be used which are common in organic EL elements.

When the organic EL element according to the present invention is used to prepare a full-color or multicolor display device, partition walls may be formed on the substrate. When partition walls are formed, it becomes possible to form the cathode in a pattern without using any metal mask or the like.

As the material for the partition walls, common materials for partition walls in organic EL elements can be used, examples of which can include, for example, light curing resins such as photosensitive polyimide resins and acrylic resins, or thermosetting reins, and inorganic materials.

In the formation of the light emitting layer in a pattern, the partition walls may be subjected in advance to a surface treatment for changing surface energy (wettability)

10. Application

The organic EL element according to the present invention may be a bottom-emission type for extracting light from the anode side, may be a top-emission type for extracting light from the cathode side, or may be a both-side emission type for extracting light from both the anode and cathode sides.

The organic EL element according to the present invention can be preferably used for display devices and lighting devices. The display devices may work by passive-matrix driving or active-matrix driving.

B. Method for Manufacturing Organic EL Element

Next, a method for manufacturing the organic EL element according to the present invention will be described.

The method for manufacturing the organic EL element according to the present invention is a method for manufacturing an organic EL element comprising: an anode; a light emitting layer formed on the anode; an electron injection and transport layer that is formed on the light emitting layer, and contains an organic boron compound; and a cathode formed on the electron injection and transport layer, and the method comprising an electron injection and transport layer forming step of applying a coating liquid for an electron injection and transport layer, which contains an organic boron compound and a solvent, to form an electron injection and transport layer.

Figure 2A:
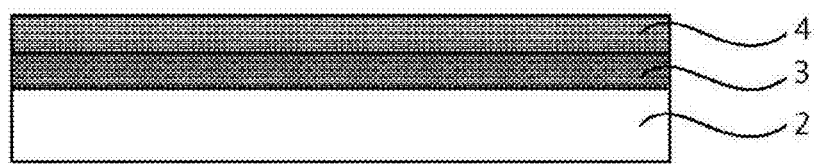
FIGS. 2A to 2D are a process drawing illustrating an example of a method for manufacturing an organic EL element according to the present invention.
Figure 2B:
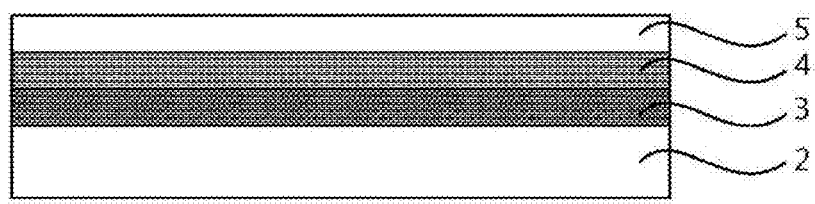
Figure 2C:
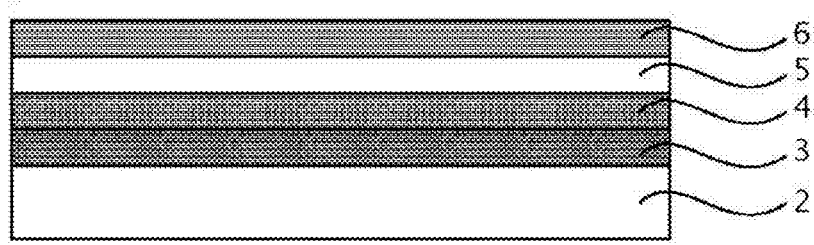
Figure 2D:
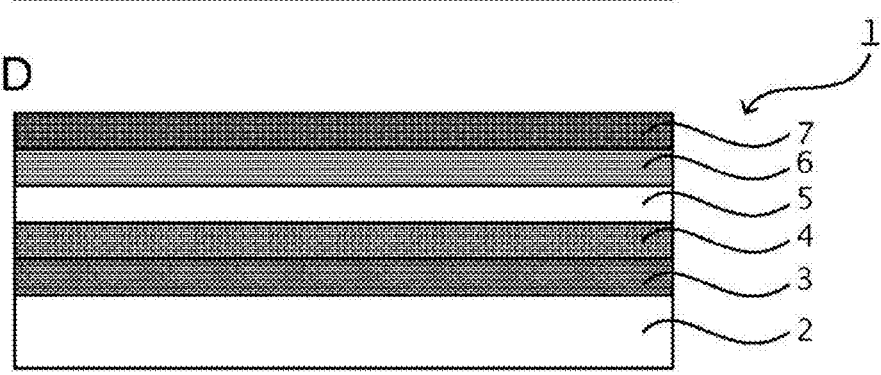

FIGS. 2A to 2D are process drawings illustrating an example of a method for manufacturing an organic EL element according to the present invention. First, as shown in FIG. 2A, a hole injection/transport layer 4 is formed on a substrate 2 with an anode 3 formed. Then, as shown in FIG. 2B, a light emitting layer 5 is formed on the hole injection/transport layer 4. Subsequently, as shown in FIG. 2C, a coating liquid for an electron injection and transport layer, which contains an organic boron compound and a solvent, is applied onto the light emitting layer 5 to form an electron injection and transport layer 6 (electron injection and transport layer forming step). Next, as shown in FIG. 2D, a cathode 7 is formed on the electron injection and transport layer 6. In this way, an organic EL element 1 can be manufactured.

When the organic boron compound is film-formed by a vapor deposition method herein, the deposited film is amorphous, because, during vapor deposition, the organic boron compound is decomposed, or the decomposed organic boron compound is mixed in the film. On the other hand, when the organic boron compound is film-formed by an application method, the deposited film is crystalline, because the organic boron compound can be prevented from being decomposed, and the decomposed organic boron compound can be prevented from being mixed.

According to the present invention, the electron injection and transport layer containing the organic boron compound is formed by an application method, and a crystalline film can be thus obtained, without having an organic boron compound decomposed or having impurities such as a decomposed organic boron compound mixed in during film forming as in a case of using a vapor deposition method. The crystalline film is presumed to have an electron transporting property improved, because the film has highly ordered atoms or molecules.

In addition, when the organic boron compound is film-formed by a vapor deposition method, there is a possibility that migration of decomposed products into the light emitting layer will be caused in driving the organic EL element to affect the light emitting characteristics of the element. On the other hand, when the organic boron compound is deposited by an application method, migration is less likely to be caused in driving the organic EL element, and it becomes possible to stably drive the element because of no decomposed organic boron compound.

Moreover, there is a possibility that crystallization will be progressed by heat or electrical energy in the amorphous film to degrade the element characteristics, whereas the crystalline film is presumed to be advantageous for continuously driving the element because the change in state is small in the film.

Therefore, in the present invention, it is possible to achieve a long service life.

In addition, a high light emitting efficiency can be achieved, because the organic boron compound is used in the electron injection and transport layer. Therefore, in the present invention, it is possible to manufacture a long-life, high-efficiency, high-performance organic EL element.

The respective steps in the method for manufacturing the organic EL element according to the present invention will be described below.

1. Electron Injection and Transport Layer Forming Step

The electron injection and transport layer forming step in the present invention is a step of applying a coating liquid for an electron injection and transport layer, which contains an organic boron compound and a solvent, to form an electron injection and transport layer.

It is to be noted that the coating liquid for an electron injection and transport layer will be described in detail later in the section of "C. Coating Liquid for Electron injection and transport layer", and the description will be thus omitted here.

The electron injection and transport layer can be formed by applying a coating liquid for an electron injection and transport layer, in which an organic boron compound is dissolved or dispersed in a solvent.

The method for applying the coating liquid for an electron injection and transport layer is not particularly limited as long as the method uses a coating liquid, and examples of the method include a dip coating method, a roll coating method, a blade coating method, a spin coating method, a micro gravure coating method, a gravure coating method, a barcode method, a wire barcode method, a spray coating method, a cast printing method, an ink-jet printing method, a flexographic printing method, a gravure printing method, an offset printing method, and a screen printing method.

Above all, in the case where the electron injection and transport layer is composed of only the organic boron compound, it is difficult to make the electron injection and transport layer a thick film, and it is thus preferable to use a method that is able to uniformly form the electron injection and transport layer as a thin film. Such application methods include, specifically, a flexographic printing method, a gravure printing method, an ink-jet printing method, a cast printing method, and a spray coating method.

After applying the coating liquid for the formation of an electron injection and transport layer, drying is generally carried out for removing the solvent remaining in the coating film. Methods for the drying include, for example, natural drying, drying by heating, and reduced-pressure drying. Above all, drying by heating is preferably carried out. This is because heating the electron injection and transport layer makes it possible to further increase the efficiency of the organic EL element.

While the heating temperature for the drying by heating is not particularly limited as long as the organic boron compound is not decomposed at the temperature, the heating temperature preferably falls within the range of, specifically, 30° C. to 300° C., and above all, more preferably within the range of 50° C. to 250° C. There is possibility that excessively high heating temperatures will decompose the organic boron compound to degrade the element characteristics, whereas the excessively low heating temperature may fail to adequately achieve the effect of the increase in efficiency in some cases.

The drying time for the drying by heating is not particularly limited unless the drying by heating deteriorates the organic boron compound or organic compound contained in the coating liquid for an electron injection and transport layer, and adjusted appropriately depending on the heating temperature. Specifically, the drying time can be set in the range of 1 second to 60 minutes.

The degree of vacuum for reduced-pressure drying is not particularly limited as long as the solvent in the coating liquid for an electron injection and transport layer can be removed, and is adjusted appropriately.

In the reduced-pressure drying, heating may be carried out for purposes such as a reduction in the drying time. The heating temperature therefor may be any temperature not higher than the heating temperature for the drying by heating.

In addition, the atmosphere for the drying may be the air atmosphere, or may be an inert gas atmosphere. The air atmosphere is advantageous for the process, because no equipment cost is required. On the other hand, the element characteristics can be further improved in the case of the inert gas atmosphere.

It is to be noted that the electron injection and transport layer has been described in detail in the section of Electron injection and transport layer in the "A. Organic EL Element", and the description will be thus omitted here.

2. Other Steps

The method for manufacturing an organic EL element according to the present invention may include, in addition to the electron injection and transport layer forming step, other steps such as a hole injection/transport layer forming step, an electron transporting layer forming step, an electron injecting layer forming step, and a cathode forming step if necessary. It is to be noted that the methods for forming the respective layers have been described in detail in the section of "A. Organic EL Element", and the descriptions will be thus omitted here.

Above all, all of the layers from the hole injection/transport layer to the cathode are preferably formed by an application method. This is because the application method requires no expensive equipment as in vapor deposition methods, and can thus reduce the manufacturing cost.

C. Coating Liquid for Electron Injection and Transport Layer

Next, the coating liquid for en electron injection and transport layer according to the present invention will be described.

The coating liquid for an electron injection and transport layer according to the present invention comprises an organic boron compound and a solvent.

The formation of an electron injection and transport layer by an application method with the use of the coating liquid for an electron injection and transport layer according to the present invention makes it possible to obtain a long-life and high-efficiency organic EL element.

The coating liquid for an electron injection and transport layer according to the present invention may contain an organic compound in addition to the organic boron compound and the solvent.

It is to be noted that the organic boron compound and the organic compound have been described in detail in the section of Electron injection and transport layer in the "A. Organic EL Element", and the description will be thus omitted here. The other constituents in the coating liquid for en electron injection and transport layer according to the present invention will be described below.

1. Solvent

The solvent for use in the present invention is not particularly limited as long as the solvent can dissolve or disperse the organic boron compound and the organic compound, and is selected appropriately depending on the types of the organic boron compound and organic compound. Examples of the solvent include, polar solvents, e.g., alcohols such as glycerin, methanol, ethanol, 1-propanol, 2-propanol, 1-butanol, ethylene glycol, propylene glycol, methyl diglycol, isopropyl glycol, butyl glycol, isobutyl glycol, methylpropylene diglycol, propylpropylene glycol, and butylpropylene glycol; ethers such as tetrahydrofurane, diethylene glycol monobutyl ether acetate, diethylene glycol monobutyl ether, propylene glycol monomethyl ether, propylene glycol monomethyl ether acetate, diethylene glycol dimethyl ether, diethylene glycol ethyl methyl ether, diethylene glycol diethyl ether, ethylene glycol monoethyl ether, and ethylene glycol monobutyl ether; ketones such as acetone and diacetone alcohol; and amides such as dimethylformamide. One of these solvents may be used by itself, or two or more thereof may be mixed.

2. Coating Liquid for Electron Injection and Transport Layer

The solid content concentration of the coating liquid for an electron injection and transport layer according to the present invention is not particularly limited as long as the coating liquid for an electron injection and transport layer can be applied onto the light emitting layer or the electron transporting layer, so that it is possible to form a uniform film, and specifically, can be set in the range of 0.01 mass % to 99 mass %. This is because the excessively increased solid content concentration makes it difficult to form a uniform film, whereas the excessively decreased solid content concentration requires longer time for drying to decrease the production efficiency.

The coating liquid for an electron injection and transport layer according to the present invention can be prepared by dissolving or dispersing the organic boron compound and the organic compound in the solvent.

The present invention is not limited to the embodiment described above. The embodiment has been described by way of example, and the technical scope of the present invention encompasses any of embodiments that have substantially the same technical idea of as that of the present invention as specified in the claims, and produce similar effects.

EXAMPLES

The present invention will be specifically described with reference to examples and comparative examples.

Example 1

As an anode, an ITO of 150 nm thick was formed in a striped pattern on a glass substrate of 25 mm×25 mm×0.7 mm (manufactured by Sanyo Vacuum Industries Co., Ltd). This ITO substrate was subjected to ultrasonic cleaning in the order of a neutral detergent and ultrapure water, and to UV ozone cleaning for 10 minutes.

As a hole injecting layer, a PEDOT-PSS thin film (thickness: 30 nm) was formed on the ITO substrate. The PEDOT-PSS thin film was formed by applying a PEDOT-PSS solution (manufactured by Bayer AG, Baytron P AI 4083™). After the application of the solution, drying at 200° C. for 30 minutes was carried out with the use of a hot plate in order to evaporate the solvent.

As a hole injection/transport layer, a conjugated polymer material, poly[(9,9-dioctylfluorenyl-2,7-diyl)-co-(4,4'-(N-(4-sec-butylphenyl))diphenylamine)] (TFB) thin film (thickness: 10 nm) was formed on the hole injecting layer. The TFB thin film was formed in such a way that a solution of TFB dissolved in xylene at a concentration of 0.4 weight % was applied by a spin coating method. After the application of the solution, drying at 200° C. for 30 minutes was carried out with the use of a hot plate in order to evaporate the solvent.

Next, as a light emitting layer, a mixed thin film (thickness: 80 nm) containing Tris[2-(p-tolyl)pyridine]iridium(III) (Ir(mppy)3) as a light emitting dopant and containing Poly(N-vinylcarbazole) (PVK) and 1,3-bis[(4-tert-butylphenyl)-1,3,4-oxidiazolyl]phenylene (OXD-7) as a host was formed on the hole injection/transport layer. The mixed thin film was formed in such a way that a solution of Ir(mppy)3, PVK, and OXD-7 dissolved in toluene at a concentration of 1.8 weight % was applied by a spin coating method. The solid content in the solution was adjusted to PVK:OXD-7:Ir(mppy)3=70:20:10 in terms of ratio by weight. After the application of the solution, drying at 110° C. for 30 minutes was carried out with the use of a hot plate in order to evaporate the solvent.

As an electron injection and transport layer, a LiBq thin film (thickness: 5 nm or less) was formed on the light emitting layer. The LiBq thin film was formed in such a way that a solution of LiBq represented by the following formula dissolved in 1-butanol at a concentration of 0.2 weight % was applied by a spin coating method. After the application of the solution, drying at 110° C. for 15 minutes was carried out with the use of a hot plate in order to evaporate the solvent.

[Chemical Formula 4]

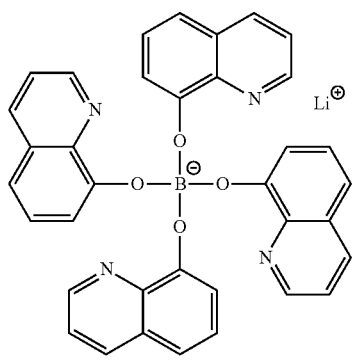

As a cathode, Al (thickness: 100 nm) was film-formed on the electron injection and transport layer. The Al was formed by a resistance heating vapor deposition method in vacuum ($1\times10^{-4}$ Pa).

Finally, after the formation of the cathode, sealing was carried out with the use of non-alkali glass and an UV curing epoxy resin in a glove box to prepare an organic EL element.

Example 2

Except that LiBPh represented by the following formula was used instead of LiBq to form an electron injection and transport layer, an organic EL element was prepared in the same way as in Example 1.

[Chemical Formula 5]

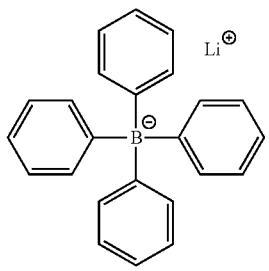

Reference Example 1

Except that Ca was used instead of LiBq to form an electron injection and transport layer, an organic EL element was prepared in the same way as in Example 1.
[Evaluation]
A voltage was applied between the anodes and cathodes of the organic EL elements according to Examples 1 and 2 and Reference Example to measure current efficiencies at 10 mA/cm$^2$, Table 4 shows the relative ratios to the current efficiency for Reference Example 1 as 100.

TABLE 4

| | Voltage (V) | Current Efficiency (Relative Ratio) |
|---|---|---|
| Reference Example 1 | 7.0 | 100 |
| Example 1 | 8.3 | 104 |
| Example 2 | 8.4 | 100 |

From Table 4, the organic EL elements with the use of the organic boron compound according to Examples 1 and 2 exhibit favorable characteristics as in the organic EL element with the use of Ca according to Reference Example.

Example 3

Except that the solid content in the solution was adjusted to PVK:OXD-7:Ir(mppy)3=70:10:20 in terms of ratio by weight in the formation of the light emitting layer, an organic EL element was prepared in the same way as in Example 1.

Comparative Example 1

Except that an electron injection and transport layer was formed by a vapor deposition method under the following conditions, an organic EL element was prepared in the same way as in Example 3.
The electron injection and transport layer of 2 nm thick was formed by a resistance heating vapor deposition method (vapor deposition temperature: 300° C.) with a pressure: $1\times10^{-4}$ Pa.

Reference Example 2

Figure 3:
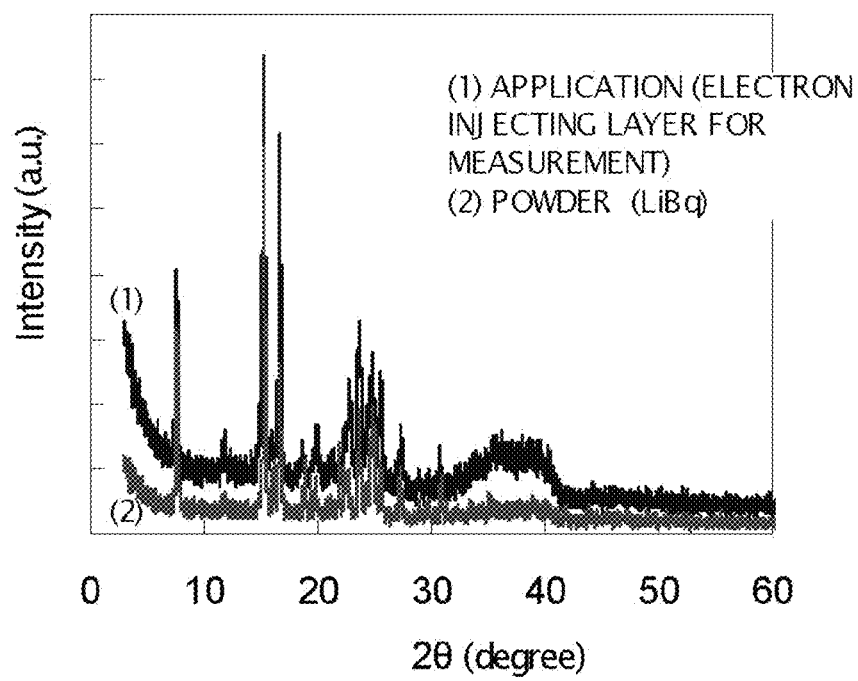
FIG. 3 is a diagram showing an example of an X-ray diffraction pattern on an electron injecting layer formed by an application method.
Figure 4:
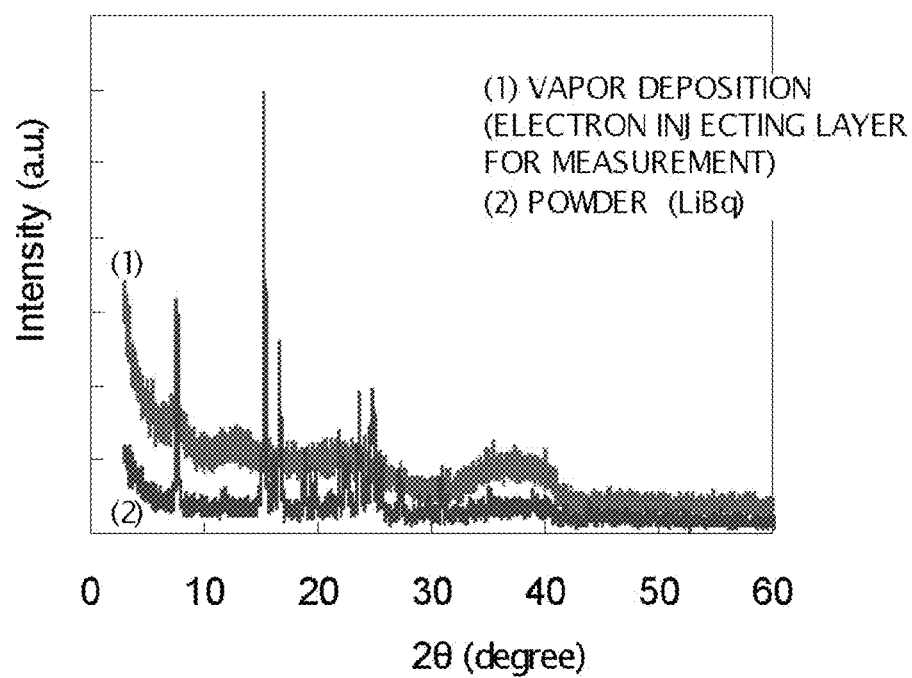
FIG. 4 is a diagram showing an example of an X-ray diffraction pattern on an electron injecting layer formed by a vapor deposition method.
Figure 5A:
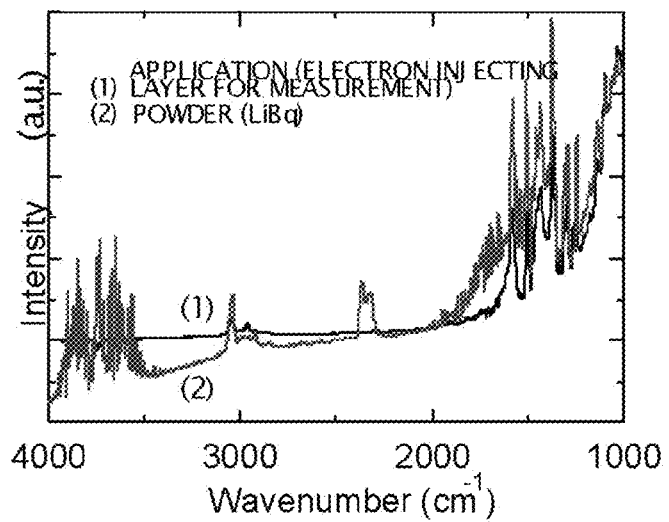
FIGS. 5A to 5C are each a diagram showing an example of an infrared absorption spectrum on an electron injecting layer formed by an application method.
Figure 5B:
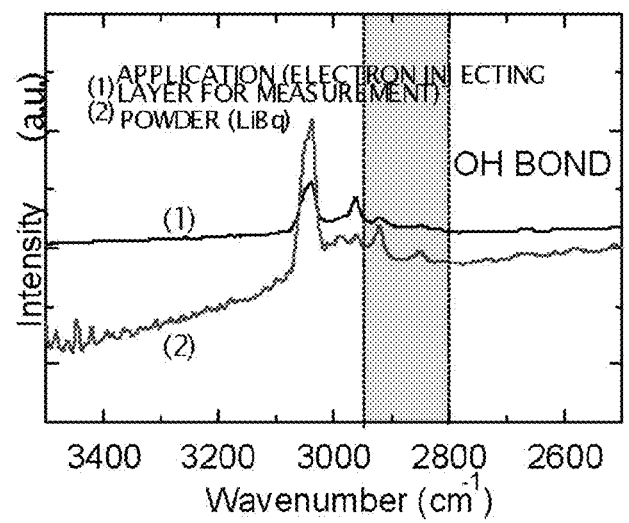
Figure 5C:
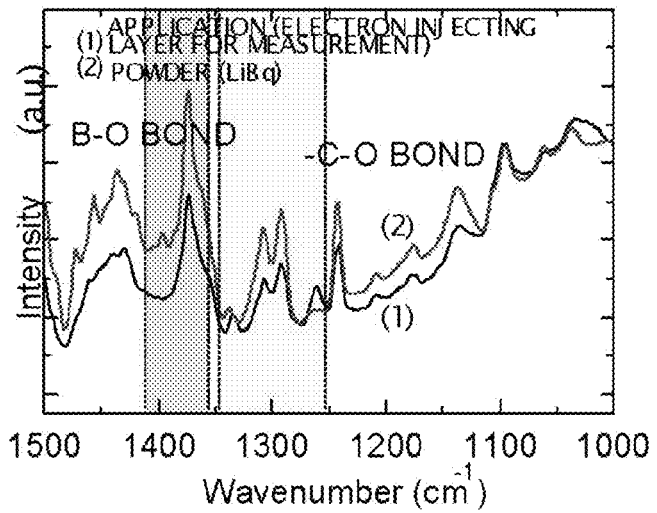
Figure 6A:
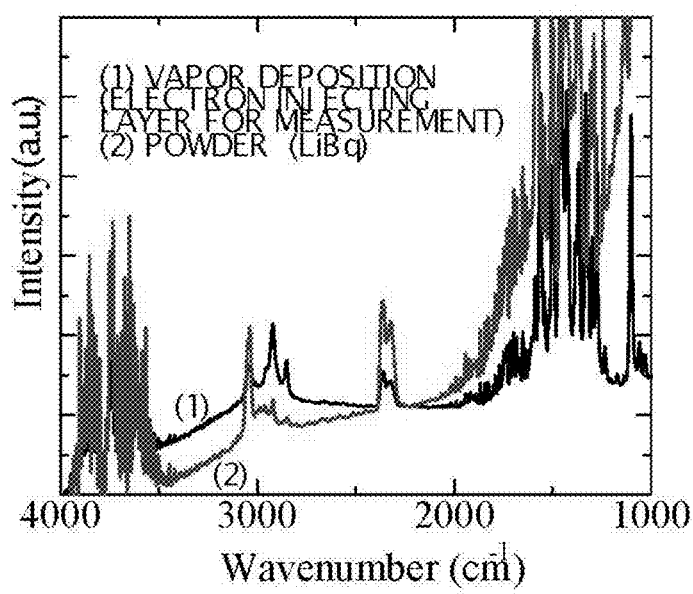
FIGS. 6A to 6C is a diagram showing an example of an infrared absorption spectrum on an electron injecting layer formed by a vapor deposition method.
Figure 6B:
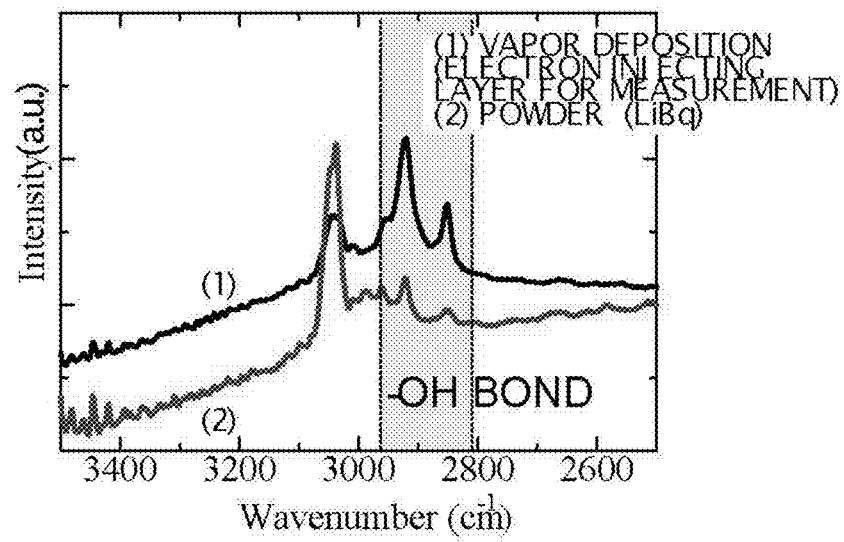
Figure 6C:
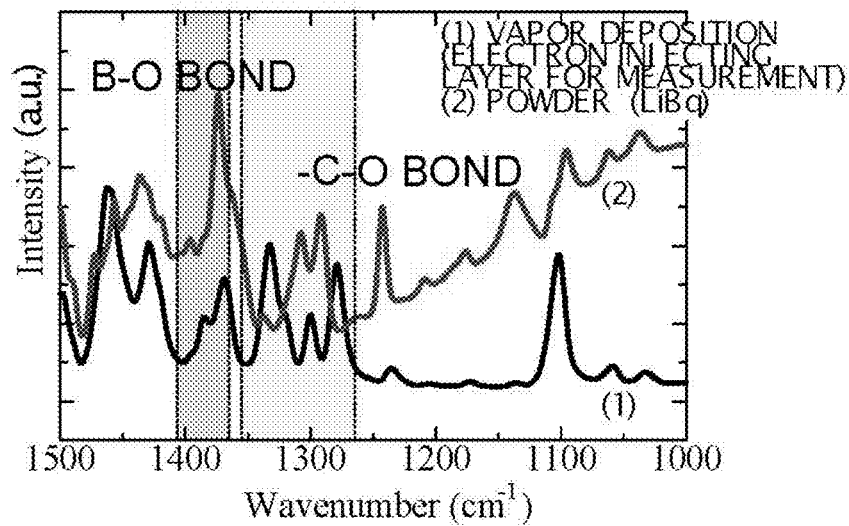

In order to check the states of electron injection and transport layers, electron injecting layers for measurement were formed respectively by an application method and a vapor deposition method.
In the application method, a solution of LiBq dissolved in 1-butanol at a concentration of 0.4 weight % was prepared, delivered by drops onto a glass substrate, and then dried at 110° C. for 15 minutes with the use of a hot plate in order to evaporate the solvent to form a film of 1000 nm in thickness.
In the vapor deposition method, a film of 1000 nm in thickness was formed by a resistance heating vapor deposition method (vapor deposition temperature: 300° C.) with a pressure: $1\times10^{-4}$ Pa.
For each electron injecting layer for measurement, measurements were carried out with the use of an X-ray diffractometer (Smartlab™ from Rigaku Corporation) and an infrared spectrometer (FT-IR610™ from JASCO Corporation). FIGS. 3 and 4 show X-ray diffraction patterns for each electron injecting layer for measurement, and FIGS. 5A to 5C and 6A to 6C show infrared absorption spectra for each electron injecting layer for measurement. It is to be noted that, FIGS. 3 to 6 show measurement results for the LiBq powder used in the electron injecting layer for measurement as a reference.
It has been confirmed from the X-ray diffraction patterns shown in FIGS. 3 and 4 that the electron injecting layer formed by the application method has a crystalline structure, whereas the electron injecting layer formed by the vapor deposition method is amorphous. In addition, in the infrared absorption spectra shown in FIGS. 5 and 6, the spectrum undergoes no substantial change in the case of the application method, while in the case of the vapor deposition method, the absorption band attributed to the —OH bond is increased in intensity, whereas the absorption bands attributed to the B—O bond and the —C—O bond are decreased in intensity. From the foregoing, it is presumed that the LiBq is not decomposed during the formation of the electron injecting layer in the case of the application method, whereas the film is formed while decomposing the LiBq in the case of the vapor deposition method.
[Evaluation]
A voltage was applied between the anodes and cathodes of the organic EL elements according to Example 3 and Comparative Example 1 to measure current efficiencies at 10 mA/cm². In addition, a current was set for brightness of 1000 cd/m² to measure the time (brightness half lifetime) until the decrease in brightness down to 500 cd/m² in the case of continuously applying the constant current. Table 5 shows relative ratios to each of the current efficiency and brightness half lifetime for Comparative Example 1 as 100.

TABLE 5

|  | Voltage (V) | Current Efficiency (Relative Ratio) | Brightness Half Lifetime (Relative Ratio) |
| --- | --- | --- | --- |
| Comparative Example 1 | 7.6 | 100 | 100 |
| Example 3 | 7.5 | 98 | 105 |

From Table 5, the organic EL element according to Example 3 with the electron injecting layer formed by the application method has a longer lifetime, as compared with the organic EL element according to Comparative Example 1 with the electron injecting layer formed by the vapor deposition method. This is presumed to be due to the difference between the application method and the vapor deposition method in the crystalline/amorphous state of the electron injecting layer.

Example 4

Except that an electron injection and transport layer was formed as described below, an organic EL element was prepared in the same way as in Example 3.

As the electron injection and transport layer, a mixed thin film (thickness: 15 nm) containing LiBq and tris[3-(3-pyridyl)mesityl]borane (3TPYMB) was formed on the light emitting layer. The mixed thin film was formed in such a way that a solution of LiBq and 3TPYMB dissolved in 1-butanol at a concentration of 0.4 weight % was applied by a spin coating method. The solid content in the solution was adjusted to LiBq:3TPYMB=1:2 in terms of ratio by weight. After the application of the solution, drying at 110° C. for 15 minutes was carried out with the use of a hot plate in order to evaporate the solvent.

Example 5

Except that LiBPh was used instead of LiBq to form an electron injection and transport layer, an organic EL element was prepared in the same way as in Example 4.

Comparative Example 2

Except that an electron injection and transport layer was formed by a vapor deposition method under the following conditions, an organic EL element was prepared in the same way as in Example 3.

The electron injection and transport layer was formed by co-deposition with the use of a resistance heating method in vacuum (pressure: $1 \times 10^{-4}$ Pa), for LiBq:3TPYMB=1:1 in terms of ratio by volume and a film thickness of 20 nm in total.

[Evaluation]

A voltage was applied between the anodes and cathodes of the organic EL elements according to Examples 4 and 5 and Comparative Example 2 to measure current efficiencies at 10 mA/cm². In addition, a current was set for brightness of 1000 cd/m² to measure the time (brightness half lifetime) until the decrease in brightness down to 500 cd/m² in the case of continuously applying the constant current. Table 6 shows relative ratios to each of the current efficiency and brightness half lifetime for Comparative Example 2 as 100.

TABLE 6

|  | Voltage (V) | Current Efficiency (Relative Ratio) | Brightness Half Lifetime (Relative Ratio) |
| --- | --- | --- | --- |
| Comparative Example 2 | 8.4 | 100 | 100 |
| Example 4 | 8.3 | 102 | 109 |
| Example 5 | 8.6 | 100 | 106 |

From Table 6, the organic EL elements according to Examples 4 and 5 with the electron injection and transport layer formed by the application method have longer lifetimes, as compared with the organic EL element according to Comparative Example 2 with the electron injection and transport layer formed by the vapor deposition method. This is presumed to be due to the difference between the application method and the vapor deposition method in the crystalline/amorphous state of the electron injection and transport layer.

Example 6

Except that a cathode was formed as described below, an organic EL element was prepared in the same way as in Example 1.

A metal (alloy) of a composition Bi—Pb—Sn (50%:25%:25%) was melted to form a cathode of 30 μm in thickness on the electron injection and transport layer. The metal of the composition was film-formed by heating the metal on a hot plate kept at 103° C., which was 10° C. higher than the melting point of the metal alloy, and melting the metal on the electron injection and transport layer.

Comparative Example 3

Except that a cathode was formed as in Example 6, an organic EL element was prepared in the same way as in Comparative Example 1.

[Evaluation]

For the organic EL elements according to Example 6 and Comparative Example 3, the current efficiency and the brightness half lifetime were measured in the same way as in the evaluation described above. Table 7 shows relative ratios to each of the current efficiency and brightness half lifetime for Comparative Example 3 as 100. The organic EL element according to Example 6 with the electron injection and transport layer formed by the application method has a longer lifetime, as compared with the organic EL element according to Comparative Example 3 with the electron injection and transport layer formed by the vapor deposition method.

TABLE 7

|  | Voltage (V) | Current Efficiency (Relative Ratio) | Brightness Half Lifetime (Relative Ratio) |
| --- | --- | --- | --- |
| Comparative Example 3 | 9.4 | 100 | 100 |
| Example 6 | 9.4 | 104 | 110 |

Example 7

Except that a cathode was formed as in Example 6, an organic EL element was prepared in the same way as in Example 4.

Comparative Example 4

Except that a cathode was formed as in Example 6, an organic EL element was prepared in the same way as in Comparative Example 2.

[Evaluation]

For the organic EL elements according to Example 7 and Comparative Example 4, the current efficiency and the brightness half lifetime were measured in the same way as in the evaluation described above. Table 8 shows relative ratios to each of the current efficiency and brightness half lifetime for Comparative Example 4 as 100. The organic EL element according to Example 7 with the electron injection and transport layer formed by the application method has a longer lifetime, as compared with the organic EL element according to Comparative Example 4 with the electron injection and transport layer formed by the vapor deposition method.

TABLE 8

|  | Voltage (V) | Current Efficiency (Relative Ratio) | Brightness Half Lifetime (Relative Ratio) |
| --- | --- | --- | --- |
| Comparative Example 4 | 9.8 | 100 | 100 |
| Example 7 | 9.6 | 110 | 107 |

Example 8

Except that a cathode was formed as described below, an organic EL element was prepared in the same way as in Example 1.

A metal (alloy) of a composition Ga—In—Sn (62.0%:25.0%:13.0%) was discharged from a dispenser to form a cathode of 30 μm in thickness on the electron injection and transport layer.

Comparative Example 5

Except that a cathode was formed as in Example 8, an organic EL element was prepared in the same way as in Comparative Example 1.

[Evaluation]

For the organic EL elements according to Example 8 and Comparative Example 5, the current efficiency and the brightness half lifetime were measured in the same way as in the evaluation described above. Table 9 shows relative ratios to each of the current efficiency and brightness half lifetime for Comparative Example 5 as 100. The organic EL element according to Example 8 with the electron injection and transport layer formed by the application method has a longer lifetime, as compared with the organic EL element according to Comparative Example 5 with the electron injection and transport layer formed by the vapor deposition method.

TABLE 9

|  | Voltage (V) | Current Efficiency (Relative Ratio) | Brightness Half Lifetime (Relative Ratio) |
| --- | --- | --- | --- |
| Comparative Example 5 | 9.6 | 100 | 100 |
| Example 8 | 9.8 | 100 | 108 |

Example 9

Except that a cathode was formed as in Example 8, an organic EL element was prepared in the same way as in Example 4.

Comparative Example 6

Except that a cathode was formed as in Example 8, an organic EL element was prepared in the same way as in Comparative Example 2.

[Evaluation]

For the organic EL elements according to Example 9 and Comparative Example 6, the current efficiency and the brightness half lifetime were measured in the same way as in the evaluation described above. Table 10 shows relative ratios to each of the current efficiency and brightness half lifetime for Comparative Example 6 as 100. The organic EL element according to Example 9 with the electron injection and transport layer formed by the application method has a longer lifetime, as compared with the organic EL element according to Comparative Example 6 with the electron injection and transport layer formed by the vapor deposition method.

TABLE 10

|  | Voltage (V) | Current Efficiency (Relative Ratio) | Brightness Half Lifetime (Relative Ratio) |
| --- | --- | --- | --- |
| Comparative Example 6 | 10.1 | 100 | 100 |
| Example 9 | 10.0 | 103 | 110 |

REFERENCE SIGNS LIST

1: organic EL element
2: substrate
3: anode
4: hole injection/transport layer
5: light emitting layer
6: electron injection and transport layer
7: cathode

The invention claimed is:
1. An organic electroluminescent element comprising:
an anode;
a light emitting layer formed on the anode;
an electron injection and transport layer formed on the light emitting layer, containing an organic boron compound and having a crystalline structure; and being non-amorphous; and
a cathode formed on the electron injection and transport layer,
wherein the organic boron compound contains an alkali metal.

2. The organic electroluminescent element according to claim 1, wherein the electron injection and transport layer further contains an electron transporting organic compound.

3. The organic electroluminescent element according to claim 2, wherein the electron transporting organic compound is a polymer compound.

4. A method for manufacturing an organic electroluminescent element comprising: an anode; a light emitting layer formed on the anode; an electron injection and transport layer formed on the light emitting layer and containing an organic boron compound; and a cathode formed on the electron injection and transport layer, the method comprising
   an electron injection and transport layer forming step of applying a coating liquid for an electron injection and transport layer, which contains the organic boron compound and a solvent, to form an electron injection and transport layer having a crystalline structure,
   wherein the organic boron compound contains an alkali metal.

5. The method for manufacturing an organic electroluminescent element according to claim 4, wherein drying by heating is carried out after applying the coating liquid for an electron injection and transport layer, in the electron injection and transport layer forming step.

6. The method for manufacturing an organic electroluminescent element according to claim 4, wherein the light emitting layer and the cathode are formed by an application method.

* * * * *